Dec. 23, 1958 P. E. GATES 2,865,082

SEMICONDUCTOR MOUNT AND METHOD

Filed July 16, 1953

INVENTOR
PAUL E. GATES
BY Paul S. Martin
ATTORNEY 2,865,082
Patented Dec. 23, 1958

2,865,082

SEMICONDUCTOR MOUNT AND METHOD

Paul E. Gates, Danvers, Mass., assignor to Sylvania Electric Products Inc., a corporation of Massachusetts Application July 16, 1953, Serial No. 368,373

1 Claim. (Cl. 29—25.3)

The present invention relates to the manufacture of semiconductor translating and transducing devices, and in particular to methods for mounting semiconductor elements to be incorporated into such devices.

In the fabrication of semiconductor devices, a widely adopted practice for mounting semiconductor elements involves cutting of a prepared slab or wafer of semiconductor material into a number of very small and thin elements or dice, followed by soldering of each of the elements individually to separate metallic supports. The mounted semiconductor element, further processed in accordance with well-known techniques to obtain desired electrical characteristics, is then combined into a semiconductor device. A typical construction is a rectifying-contact crystal diode which comprises a semiconductor element united to a supporting lead and having a prepared surface contacted by the end of a resilient contact element, the assembly of the semiconductor and contact elements being enclosed in an air-tight envelope of appropriate glass or ceramic.

Individual mounting of the cut semiconductor elements on their respective supports is a time-consuming and laborious manual operation, especially when it is recalled that both the semiconductor element and its support are very small, the support frequently being a wire having a diameter of the order of .03 inch. In this operation, care must be taken to avoid overhang of the dice beyond the edge of the supporting wire. Further, care must be taken to avoid contamination of the prepared surface of the semiconductor element which may require further processing, such as etching to remove the deposits incident to mounting of the semiconductor element by soldering with a corrosive flux. Still further precautions must be taken to mount the semiconductor element with its contact surface accurately disposed in perpendicular relation to its supporting pin to minimize the tendency of a sharp contact to "skate" across the prepared surface, as when brought into endwise contact in a typical rectifying-contact diode.

Accordingly, it is an object of the present invention to provide a novel method for mounting semiconductor elements which obviates one or more of the aforesaid difficulties. Specifically, it is within the contemplation of the invention to provide a novel method for mass-producing semiconductor assemblies, each including a semiconductor unit having an attached support, which is compatible with the several mechanical and electrical requirements imposed for easy and successful incorporation into known semiconductor devices.

The above and still further objects, features and advantages of the invention will become apparent upon reference to the following detailed description of several presently preferred methods, taken in conjunction with the accompanying drawing, wherein.

Although the present invention will be described with germanium as the semiconductor, it is to be understood that the disclosed methods may be employed to mount a variety of semiconductor materials prominently silicon which like germanium is extremely hard, brittle, and is formed as a large crystalline ingot that is cut into individual slices whose surfaces require meticulous processing. The invention will be recognized as being equally adapted to the manufacture of a variety of semiconductor devices, although the specific illustrative examples will pertain to rectifying-contact semiconductor diodes.

Figure 1A:
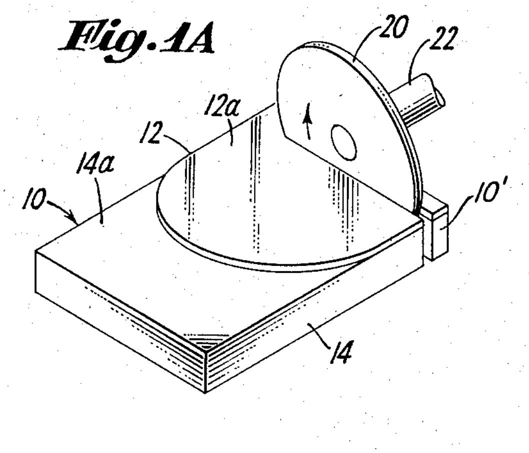
Fig. 1A is a perspective view, with parts broken away of a process embodying features of the present invention, showing a first cutting step in the preparation of mounted semiconductor elements.
Figure 1B:
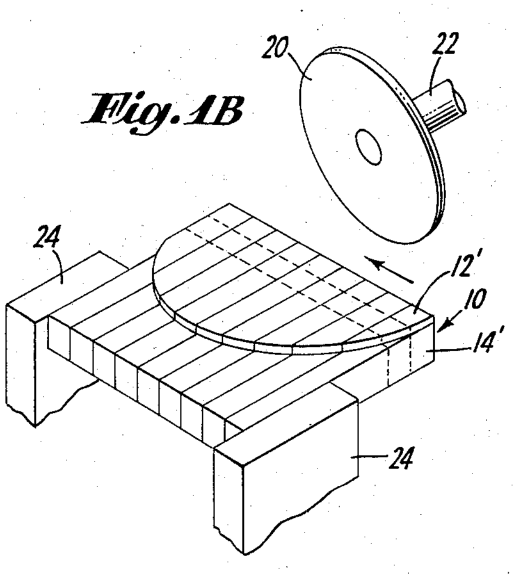
Fig. 1B is a perspective view similar to Fig. 1A showing a further cutting step in the preparation of the mounted semiconductor element.

Referring now specifically to Figs. 1A and 1B, there is shown a unitary assembly 10 of a semiconductor wafer 12 and a conductive supporting material 14. Specifically, the semiconductor element is in the form of a slab or wafer of germanium or the like having a thickness of the order of .005 inch and cut from a solid ingot of germanium, suitably a single-crystal ingot of high purity and containing a suitable doping constituent for imparting N-type or P-type conductivity in amount to produce a desired resistivity, as one to 30 ohm-centimeters. The wafer is prepared for mounting in accordance with well understood techniques, as by being ground flat and polished on the surface to be secured to the supporting material 14, and optionally plated with rhodium, copper or the like to facilitate soldering to the support. This assures provision of a low-resistance non-rectifying or ohmic contact between the wafer 12 and the support 14. The surface 12*a* of the wafer 12 remote from the support 14 is prepared to exhibit prescribed semiconductor properties, as by etching with a suitable reagent to remove the mechanically worked surface regions followed by washing, drying and baking.

The support 14 is a block of material suited for incorporation into semiconductor devices, for example brass, nickel, or Kovar. To facilitate joining to the semiconductor 12, the surface 14*a* of the support 14 may be tinned or plated as is well understood. As a notable feature of the invention, it is possible to initially orient the relatively large prepared surface 12*a* of the semiconductor wafer 12 in substantial parallelism with the surface 14*a* of the support 14 to obtain final orientation of the relatively small individual semiconductor elements with relation to their respective supports. With the plated semiconductor wafer 12 assembled on the surface 14*a* of the support 14, heat is applied until the adjoining surfaces are bonded together substantially in the plane of abutment of the wafer 12 and of the support 14 thereby rigidly securing the slab of germanium to the underlying support.

The mounting is completed by dividing the semiconductor wafer 12 to form plural semiconductor elements 12′ each having an affixed part 14′ of the conductive supporting material 14. Specifically, in accordance with the process illustrated in Figs. 1A and 1B, the division of the integral assembly is accomplished by severing both the semiconductive wafer 12 and the support 14 by intersecting cuts normal to each other and to the plane of abutment. The orientation of the intersecting cuts with reference to the plane or surface 14$a$ assures that the prepared surface 12$a$ of the semiconductor wafer will be disposed perpendicularly to the integral affixed supporting part 14'. When it is considered that a sharp contact tends to "skate" across a slant surface, the importance of this aspect of the invention may be appreciated.

As seen in Fig. 1 the first cutting operation involves the provision of parallel cuts common to the wafer 12 and the support 14 to form strip subassemblies, one such subassembly being designated by the notation 10'. The plural parallel cuts are formed by an appropriate metallic cutting wheel 20 charged with diamond particles and rotated by a suitably driven shaft 22. As can be seen in Fig. 1B, the subassemblies 10' may be stacked in an appropriate vice or jig 24 and moved relative to the cutting wheel 20 to provide further parallel cuts common to the wafer and support and substantially normal to the first-named parallel cuts. The second cutting operation subdivides the individual strip asemblies 10' into the integral semiconductor elements 12' having the affixed parts 14' of the support 14. It is to be stressed that the dimensions and the number of units in the drawings are symbolic, and not intended to be accurate. Processing of a single assembly will yield a large number of mounted elements, especially when it is recalled that the final mounted elements are approximately .03 inch from side to side.

Figure 2A:
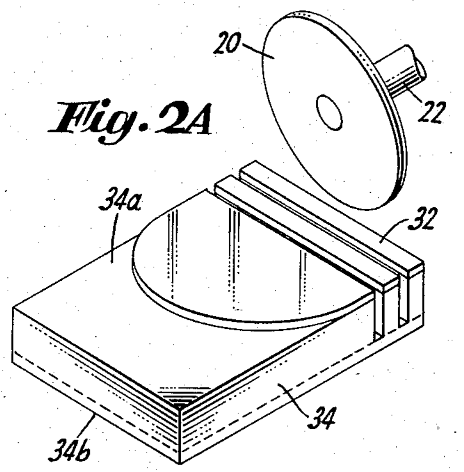
Fig. 2A is a perspective view, with parts broken away, of a modified process embodying further features of the invention and showing a first cutting step in the preparation of mounted semiconductor elements.
Figure 2B:
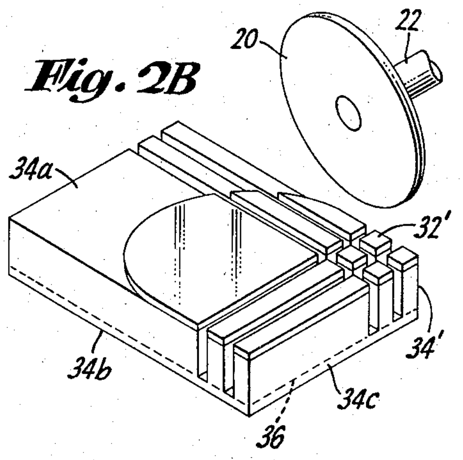
Fig. 2B is a perspective view similar to Fig. 2A showing a further cutting step in the preparation of the mounted semiconductor element.

Reference will now be made to Figs. 2A and 2B which show a further process of the invention embodying a modified severing operation. Specifically a slab or wafer of semi-conductor material 32 is mounted on a surface 34$a$ of a conductive support 34 as described. Thereupon, the cutting wheel 20 is employed to form a plurality of parallel cuts normal to the wafer and terminating short of the undersurface 34$b$ of the support 34 remote from the surface 34$a$. As seen in Fig. 2$b$ a further set of cuts are provided intersecting and perpendicular to the first set of cuts, the further cuts likewise terminating short of the undersurface 34$b$ of the conductive support 34. The intersecting cuts define individual semiconductor units each having an integral part 34' of the support upon which is mounted a small chip or square 32' of germanium, the individually mounted units being temporarily joined together by the uncut part 34$c$ of the conductive support 34. This temporary jig of fixture 34$c$ is removed when it is desired to separate the respective semiconductor units 32', 34', as by butting in the plane 36 defined by the broken lines. Alternatively, the support 34 may be prepared with a soldered interface at plane 36, so as to enable removal of the units by heating. In either event, the unit may be clamped or magnetically held by engaging the block portion below plane 36.

Figure 3:
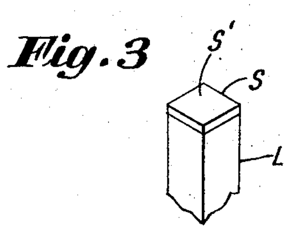
Fig. 3 is a perspective view, with parts broken away, showing a typical mounted semiconductor element processed in accordance with the methods of either Figs. 1A and 1B or Figs. 2A and 2B.

From the foregoing, it can be seen that the methods of either Figs. 1A and 1B or Figs. 2A and 2B yield a mounted semiconductor unit which, as seen in Fig. 3, includes a square or chip S of semiconductor material, integral with a supporting lead L of substantially square cross-section. The prepared surface s' of the semiconductor chip S is disposed normal to the longitudinal axis of the supporting lead L. The semiconductor is usually extremely sensitive to heating, which may cause deterioration of the prepared surface. The support here provided is of great length as compared to its cross-section. Accordingly the support can be soldered or welded in its final mount, by virtue of the thermal isolation afforded by the proportions of the support.

Figure 4:
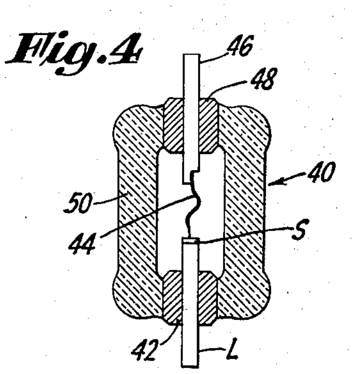
Fig. 4 shows an illustrative semiconductor device embodying the mounted semiconductor of Fig. 3.

In Fig. 4 there is illustrated a completed rectifying contact crystal unit 40 embodying the semiconductor element S processed in accordance with either the method of Figs. 1A and 1B or Figs. 2A and 2B. The mounted semiconductor element S is fixed within a metallic sleeve 42 having a hobbed square hole snugly receiving the supporting lead L. The prepared semiconductor surface $s'$ is contacted by an appropriate tungsten whisker 44 mounted on a lead 46 fixed within a further sleeve 48 arranged in end-wise alignment with the sleeve 42. The assembly is sealed within an appropriate glass or ceramic envelope 50 with projecting portions of the respective supporting leads serving as connectors to external circuits.

Assurance that the prepared surface $s'$ of the germanium element S will be disposed perpendicularly to its supporting lead L results in higher yields of uniform and stable units. Moreover, the corrosive flux used in soldering the germanium wafers to the support will not tend to spatter the prepared germanium surface, especially in regions offset inwardly from the marginal areas which may inadvertently be exposed to the flux. To avoid even this contingent hazard to the edge portions of the slab, the surface preparation of the slab may be effected after mounting. Further, after dividing of a single wafer into individual semiconductor elements in accordance with the present invention, it is possible to complete a large number of semiconductor units without the necessity of cleaning and etching after mounting. The subdivision of the slab and its support into separate completed units vastly reduces the required handling entailed in the prior practices of individual mounting of individual dice on individual supports, and individual handling of such mounted dice during etching, etc.

Since variations in detail and varied application of the foregoing disclosed embodiments of the invention will occur to those skilled in the art, it is appropriate that the appended claim shall be accorded a broad interpretation consistent with the spirit and scope of this invention.

What I claim is:

In the manufacture of semiconductor devices, the steps including preparing a semiconductor wafer, fixing said wafer in abutment against one surface of a conductive support, severing said wafer and support by intersecting cuts normal to said one surface to provide individual semiconductor units each having an integral part of said support defined by said intersecting cuts, the intersecting cuts being common to both said wafer and support and terminating short of a surface of said support opposing said one surface to leave a temporary part of said support common to said individual semiconductor units, and removing said temporary part of said support to separate said semiconductor units.

References Cited in the file of this patent

UNITED STATES PATENTS

| | | |
|---|---|---|
| 2,326,063 | Peter | Aug. 3, 1943 |
| 2,402,839 | Ohl | June 25, 1946 |
| 2,438,892 | Becker | Apr. 6, 1948 |
| 2,576,267 | Scaff et al. | Nov. 27, 1951 |